United States Patent [19]

Schramm et al.

[11] Patent Number: 4,789,536
[45] Date of Patent: Dec. 6, 1988

[54] PROCESS FOR PRODUCING SILICON CARBIDE WHISKERS

[75] Inventors: Dale E. Schramm; Donald W. Birtell, both of Borger, Tex.

[73] Assignee: J. M. Huber Corporation, Rumson, N.J.

[21] Appl. No.: 4,505

[22] Filed: Jan. 20, 1987

[51] Int. Cl.⁴ .............................................. C01B 31/36
[52] U.S. Cl. ...................................... 423/345; 423/346
[58] Field of Search ................................ 423/345, 346

[56] References Cited

U.S. PATENT DOCUMENTS

| | | | |
|---|---|---|---|
| 3,161,473 | 12/1964 | Pultz | 23/208 |
| 3,306,705 | 2/1967 | Leineweber et al. | 23/208 |
| 3,519,472 | 7/1970 | Dyne et al. | 117/106 |
| 3,758,672 | 9/1973 | Lewis | 423/345 |
| 3,773,899 | 11/1973 | Lewis | 423/346 |
| 3,778,296 | 12/1973 | Thalmann et al. | 117/106 |
| 4,118,464 | 10/1978 | Cutler | 423/346 |
| 4,199,545 | 4/1980 | Matovich | 422/112 |
| 4,284,612 | 8/1981 | Horne, Jr. et al. | 423/345 |
| 4,500,504 | 2/1985 | Yamamoto | 423/345 |
| 4,504,453 | 3/1985 | Tanaka et al. | 423/345 |
| 4,536,379 | 8/1985 | Carlson et al. | 423/345 |
| 4,591,492 | 5/1986 | Tanaka et al. | 423/345 |
| 4,637,924 | 1/1987 | Beatty et al. | 423/345 |
| 4,671,944 | 6/1987 | Schramm et al. | 423/659 |

FOREIGN PATENT DOCUMENTS 2162504 2/1986 United Kingdom .

Primary Examiner—John Doll
Assistant Examiner—Lori S. Freeman
Attorney, Agent, or Firm—Harold H. Flanders; Alec H. Horn; Loren G. Helmreich

[57] ABSTRACT

A method of manufacturing silicon carbide whiskers in which silicon and carbon containing feedstock is placed on a series of gas permeable supports and passed through a reaction zone. The feedstock is maintained at 1500° C. to 1700° C. between forty to eighty minutes while the off gases from other reacting feedstock is permitted to pass from one support to another. In this manner uniformity of environment is maintained to produce high quality silicon carbide whiskers having average diameters by mass between 1 and 1.5 microns.

9 Claims, 2 Drawing Sheets

PROCESS FOR PRODUCING SILICON CARBIDE WHISKERS

BACKGROUND OF THE INVENTION

The present invention relates to a process for producing silicon carbide whiskers and more particularly to a process for producing silicon carbide whiskers of higher quality and high yield. Silicon carbide in the form of whiskers with a high aspect ratio of length to diameter has been proposed for use as a reinforcement in metals and a toughener in ceramics and thereby greatly enhance their utility.

Considerable scientific study of silicon carbide whiskers has been done and their properties have been found to be of great utility in reinforcing and toughening solids but commercial development has been limited by the extremely high cost of production.

Silicon carbide whiskers have been reported produced by a variety of techniques, however the most significant are the Tateho process, the Tokai process and the ARCO process.

The Tokai process as taught by Yamamoto, U.S. Pat. No. 4,500,504 involves exchanging a water soluble catalyst on to a silica gel and mixing the dried silica gel with a very fine particle carbon black in a 5.5 to 100 $C/SiO_2$ molar ratio and reacting the mixture in an non-oxidative atmosphere at a temperature between 1300° C. and 1700° C. in an enclosed container in an electric furnace to produce silicon carbide whiskers. In addition 200% by weight sodium chloride is added to the mixture to produce longer and more uniform whiskers. The reaction time is on the order of two to four hours.

The Tateho process, taught by Tanaka et. al. U.S. Pat. No. 4,504,453, involves thin layers of porous silicon and carbon containing feedstock on a series of trays moved through a series of heating zones which successively heat the feedstock, to 1300° C. while a non-oxidizing gas is purged through the feedstock in each tray to remove impurities. Once purified the feedstock is again moved in stages through a series of temperature zones from about 1350° C. to 1450° C. to effect whisker growth. The preferred time in the high temperature zone (1350° to 1450°) is four to ten hours.

Although much is not known about the ARCO process it is believed to be a process involving the heating of coked rice hulls at a temperature above 1600° C.

Cutler U.S. Pat. No. 4,118,464 describes a process for preparing a two phase mixture of silica and carbon in a stochiometric molar ratio, reacting the silica/carbon mixture to produce SiO vapor and transporting the SiO vapor from the first phase into a second phase consisting primarily of pure carbon. To produce silicon carbide whiskers in the second location this reaction is carried out above 1200° C. and iron is thought to accelerate the reaction.

Also of interest is Hayashi et al U.K. patent application GB No. 2,162,504A, assigned to Nippon Light Metal Company.

This process involves a mixture of carbon and silica with a controlled bulk density between 0.03 and 0.15 $g/cm^3$ in the absence of catalyst. This mixture is placed in containers which are either sealed or vented to the outside and heated to 1500° to 2000° C. under an inert atmosphere as it is lowered through a push furnace.

One of the problems unsolved until the present invention was obtaining a reasonable yield of high quality SiC whiskers, in reasonable reaction times to be economically practical, having an average diameter by mass basis greater than or equal to 0.75 micron at high yields without simultaneously producing hard to remove silicon carbide particulae.

SUMMARY OF THE INVENTION

It is the object of the present invention to provide a process for the production of silicon carbide whiskers at high yields and low particulate levels.

It is another object of the present invention to produce whiskers with larger average diameters on a mass basis than can be achieved using prior art process in a controlled fashion.

It is a further object of the present invention to produce whiskers in a highly uniform environment.

It is a further object of the present invention to produce whiskers utilizing the transport of offgases of the reaction from one reaction cavity to another.

It is yet another object of the present invention to produce whiskers at minimum reaction times to promote the production of whiskers verses silicon carbide prticules.

It is yet another object of the present invention to produce whiskers using inexpensive, easily available and minimally manipulated feedstocks.

It is yet another object of the present invention to produce whiskers having an average diameter on a mass basis greater than or equal to one micron.

DETAILED DESCRIPTION OF INVENTION

To attain these objects according to one aspect of the invention, a feedstock containing silicon, carbon, and catalyst is placed on a gas-permeable support, such as a tray having a perforate bottom, and each tray support is stacked one upon the other. These trays are first maintained in a preheating zone which is kept below the initiation temperature of the reaction of silica and carbon to produce SiO and CO vapor, which in turn are the reactants for the SiC whisker.

Thereafter, the supports are rapidly brought from a temperature well below 1300° C. to a predetermined temperature between 1500°–1700° C. which is held as constant as possible. Because the reaction rate for the formation of SiC whiskers is fast and the reaction rate for the formation of particles is slow, the process of the present invention maintains the support trays at ideal reaction temperature for as brief a period as possible. The high uniformity of conditions of the present inventions permits substantially complete reaction between 40 to 80 minutes and hence the ratio of SiC whisker to SiC particulate is very high and the particulate that is formed is very small and therefore less harmful to the toughing and reinforcing properties of the whisker product. It is found that longer reaction times produce more and larger particulate.

After the required reaction time, the support trays are rapidly cooled to below 1300° C. to quench the SiC reaction.

Another factor which influences the quality of whisker that is addressed by the process of the present invention is uniformity of reaction conditions. It is important to the present invention that the gaseous products of the reactions of silica and carbon, hereinafter offgases, be permitted to pass through or percolate through the reactant feedstock. The offgases contain CO and SiO at whisker formation temperature and by passing through the feedstock promote whisker formation and keep the partial pressure of each reactant gas as homogeneous as possible thus promoting the formation of larger diameter, more desirable whiskers even though higher temperature in conventional processes promotes the formation of smaller diameter whiskers.

In a like manner the percolation of offgases throughout the reaction zone insures highly uniform temperature and pressure within the reaction feedstock in a manner hereinafter discussed, to promote larger diameter and higher quality whiskers.

In order to more particularly describe the present invention an example of a reactor capable of carrying out the process of the present invention is described below. It is understood that a person skilled in the art vary the reactor while practicing the process of the present invention.

Figure 1:
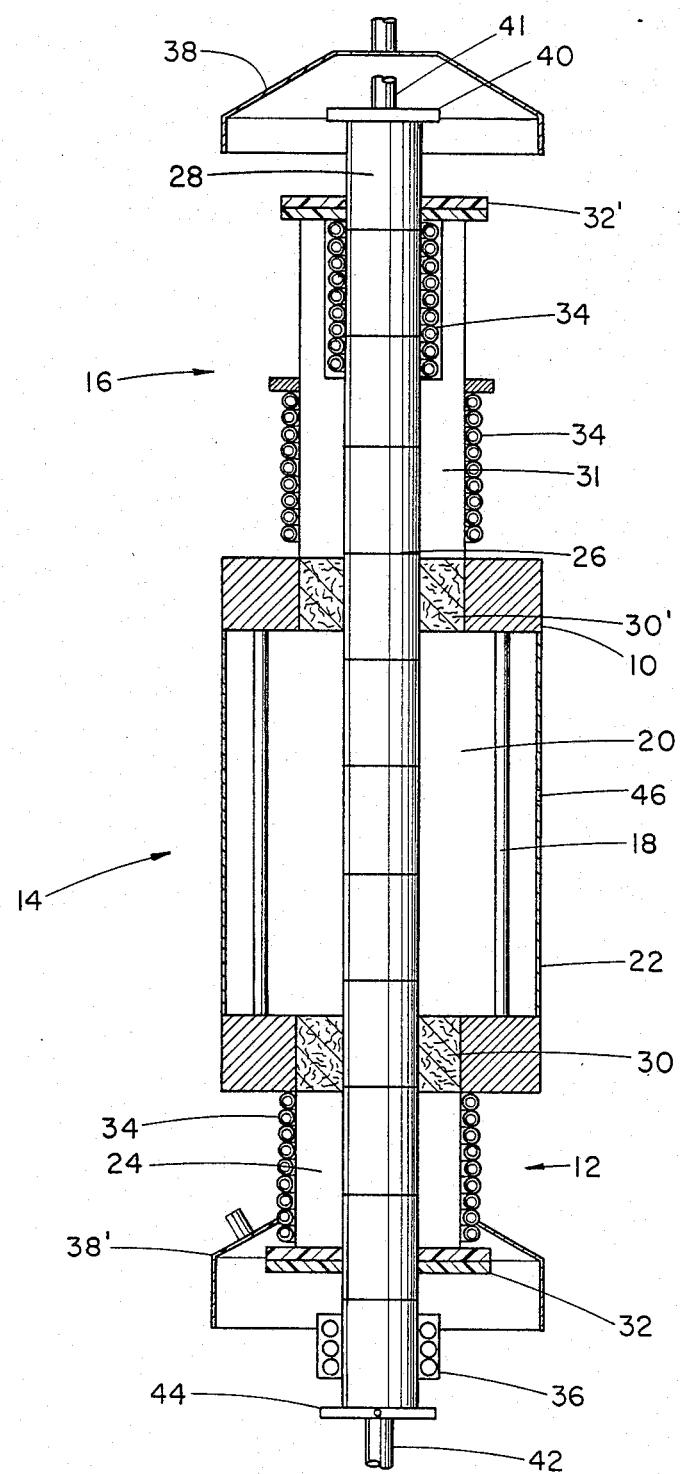
FIG. 1 is a drawing which depicts, in partial cross section, a furnace used to produce whiskers according to the process of the present invention.

Referring to FIG. 1, a suitable reaction furnace 10 may be seen having a preheating zone, 12 a reaction zone 14 and a cooling zone 16 and suitably designed to meet the temperature conditions. A plurality of heating means 18 such as electrodes are disposed within electrode chamber 20 formed within in an insulated reactor shell 22. A vertical passage 24 is provided through the reactor 10 to permit a core 26 made up of a series of stacked cylindrical core sections 28 to pass. Graphite felt packing 30,30' is placed in the annulus 31 between the core 26 and the reactor 10 to create a thermal boundary between the hot reaction zone 14 and cooler zones 12, 16 which also acts to partially isolate the atmosphere of the electrode chamber 20. Further, at each entry and exit of the reactor passage, 24 a set of seals 32,32' of a temperature resistant polymer is placed to prevent intrusion of air into the reactor 10. Cooling means such as water cooling coils 34,34' about the preheat zone 12 and the cool zone 16 are provided to cool the core sections 28 to prevent premature reaction, quench the reaction upon completio and to facilitate handling of the core sections upon removal. A core support means 36 such as a clamp is placed below the reactor to facilitate the passing of core sections through the reactor by temporarily supporting the core 26 while additional new core sections are added. Above the reactor is an exhaust hood 38' to remove any offgases escaping in the reactor area and a vacuum cap 40 attached to a vacuum line 41 to create a slight negative pressure to promote the percolation of offgases through the reactor core sections, and release unwanted localized pressure buildup. Below the reactor 10, a lifting means 42 is provided to lift and move the core sections 28 through the reactor 10 at a continuous, steady, adjustable rate. Optionally, a gas injection port 44 is placed within the lift means 42 to permit injection of gases such as CO, $N_2$ or methane through the core sections to augment the offgas. Further a purge gas port 46 is provided within the reactor electrode chamber 20 to permit the chamber to be positively pressurized with an inert gas such as $N_2$ to both prevent leakage of offgases between joints 48 of the core sections into the electrode chamber 20 and, further avoid any intrusion of atmosphere into the vertical passage 24 of the reactor. A pressure of about 2480 Pa has been found to be adequate.

In operation, after a core section is filled with feedstock and assembled, as later described, five core sections, each core section containing four trays of feedstock, are placed on the lift table and fitted to the tapered shiplap joint of the core sections already in the reactor and placed on the lift table. The mechanism slowly lifts the cores through the reactor at a predetermined rate to control the amount of time each core section spends in each temperature zone. A turnaround time of approximately two minutes is needed to lower the lift mechanism while the cores still in the reactor are held in place by a clamping mechanism and an additional five core sections are placed on the table and fitted to base of the core sections above. This two minute pause is insignificant in the control of the reaction process.

As the cores sections are passed through the preheating zone 12 the sections are preheated from ambient temperature to a temperature substantially less than 1300° C. until the sections begin to enter the hot reaction zone 14 of the reactor. As a section passes from preheat zone 12 to the reactor zone 14, the temperature of the sections and its contents is rapidly raised to a temperature between 1500°–1700° C., with 1600° C. preferred. The rate is sufficient to minimize the time spent between 1300° C. and 1600° C. which in turn avoids the production of $S_iC$ particulate. The section is maintained at as close to constant temperature as possible as the core sections progress through the reactor zone. In the present embodiment, the temperature profile of the reactor zone has been kept flat allowing a variation in temperature of about plus or minus 50° C. throughout the length of the reaction zone by keeping the temperature at a thermocouple placed on the core one-third the distance of the reactor zone at 1600° C. plus or minus three degrees. The core sections are slightly hotter at the halfway point and slightly cooler near the cooler zones. In the preferred embodiment the reactants are maintained in the reaction zone for approximately 40 to 80 minutes with 60 minutes the most preferred. As the core section exits the reactor zone to the cooling zone, the temperature of the core sections is rapidly brought below 1300° C. to quench the silicon carbide reaction. As the core sections pass through the cooling zone they are cooled sufficiently for handling. The sections exit through the top of the reactor, the vacuum cap 40 is briefly removed to permit removal of the section and the contents removed by vacuum line.

Figure 2:
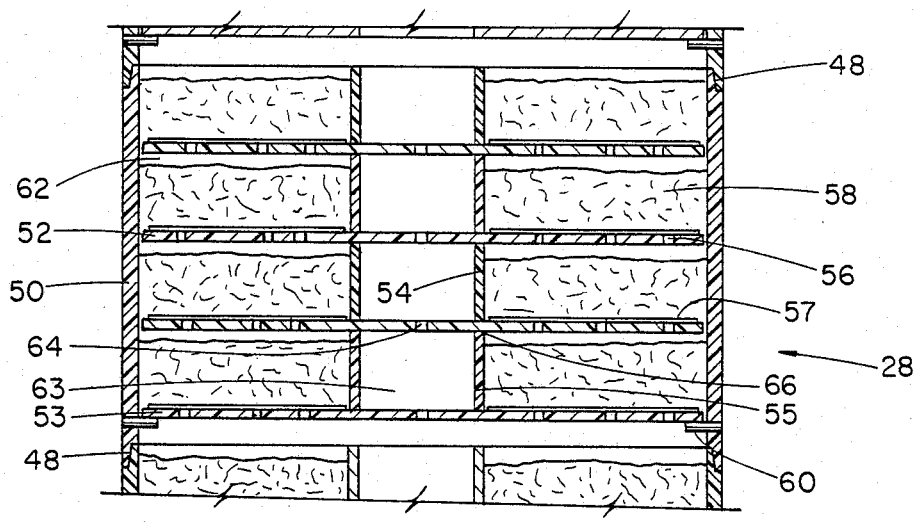
FIG. 2 is a drawing which depicts in cross-section, a core section of the furnace in FIG. 1.
Figure 3:
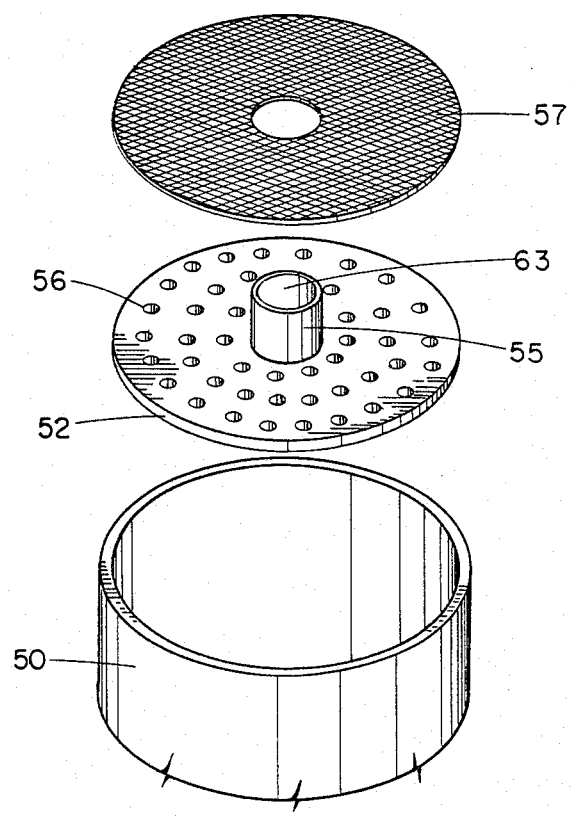
FIG. 3 is a drawing which shows another view of the core section of FIG. 2.

Referring now to FIGS. 2 and 3, there may be seen a core section comprising a heat resistant cylindrical body 50, preferably of graphite, feedstock supports such as tray plates 52 with a spacer 54 affixed to the support 52. This tray spacer 54 may be in the form of a short tube of graphite having sufficient strength to support the trays above. These feedstock supports 52 or tray plates are made gas permeable by any appropriate means. In the preferred embodiment a plurality of small bore holes 56 in the range of 0.15–2.5 cm. are drilled in the area outside the spacer to permit the passage of gas. If desired, a cloth 57 of graphite, cotton, ect. is placed on each tray plate 52 to prevent feedstock from falling through the holes 56 during handling. Three graphite support pins 60 or similar support means are placed in the lower portion of a core body 50, to support the bottom tray plate 53. The bottom tray 53 is charged with feedstock and a second tray plate 52 is introduced and supported by the bottom plate tray spacer 55. In like fashion each tray is filled with feedstock such that a completed core section, may easily be seen as multiple layers of perforated plates defining reaction cavities 62 filled with feedstock with each cavity having a porous bottom and a porous top. If required, in a particularly preferred embodiment it may be seen that the tray spacers 54 can form a channel 63 which may conduct gas therein throughout the length of a series of core sections if a small leak point 64 such as a few small holes were placed in the plate within the tray spacer. This channel 63 with its high flow resistance serves as an pressure relief system to minimize local high pressure areas and control the flow of the offgases through the reaction cavities 62. In the event that the pressure becomes too high in a reaction cavity, offgas will leak through the joint 66 between the spacer and the plate above into the spacer channel to the head space of the core section to be evenly distributed. Because the vacuum cap produces a negative pressure in the spacer channel and the purge gas creates a positive pressure in the electrode chamber, any off gas will migrate to the channel rather than the electrode chamber. The resistance to gas flow of the channel may be regulated by the size or number of leak points in the tray plate. In practice it has been found to be convenient to have restricted leak points only in the bottom tray plate. The upper tray plates have substantially unrestricted leak points. In this manner if the flow in the channel is excessive, a plug of graphite wool in the bottom plate spacer will decrease it.

It can easily been seen therefore that the offgases produced in a reaction cavity will be mixed with the offgases from the cavity below and any nitrogen seeping between the core sections. All of these gases will pass either through the perforate holes of the trays and, likewise, the reactants or through the tray spacer channel 63.

It should be emphasized that only a small portion of the gases pass through the spacer channel in relation to the gas passing through the tray above. As each reaction cavity evolves offgas, there is a slight build up of pressure which is relieved by passage of the gas into the cavity above or, if excessive, through the loose fitting joint 66 between a tray spacer 54 and the tray plate above. In this way gas pressure produced by the reaction never builds up in a localized manner but is kept extremely uniform throughout the series of tray plates. It can be seen that this arrangement provides for a highly uniform temperature by convection of traveling gases; highly uniform partial pressure of the reactant gases; highly uniform gas flow patterns; and highly uniform concentration of catalyst vapors throughout the process. As a secondary benefit the flow of offgas through the reaction material promotes elutriation and void spaces for the growth of whiskers by minimizing compaction during the reaction.

A feedstock is prepared as a 5:1:0.06 molar ratio mixture of (a) Monarch 900 carbon black, a furnace carbon black produced by Cabot Corporation, having a bulk intensity of approximately 0.22 g/cm$^3$ and (b) Cabosil M-5 fumed silica produced by Cabot Corporation, and (c) Anhydrous ferric chloride powder. Alternatively, the catalyst content may be expressed as 12 weight percent of iron to silicon. These reactants are added together and ball milled to produce a mixed feedstock having a final bulk intensity of approximately 0.093 g/cm$^3$.

Each support or tray is filled to a depth between one to four inches. If a bed depth is too thick, the feedstock weighs down upon itself and compacts as it reacts reducing the size of the voids causing inferior quality whiskers to be formed. The reaction efficiency also suffers with thick beds due to poor heat transfer characteristics. It is preferred that the feedstock depth be less than 8 inches for compaction and heat transfer characteristics but greater than one-half inch deep for practical economic consideration. A more preferred depth is one to four inches.

For stoichiometry, at least three moles of carbon per mole of SiO$_2$ are needed. The preferred ratio of the present invention is five moles of carbon per mole of SiO$_2$. The excess carbon insures complete reaction and also adds bulk and void spaces for growth sites of the whiskers. Because of the uniformity of reaction conditions of the present invention, raising the carbon/silica ratio above five does not substantially increase quality but merely lowers the throughput of the process. The size and the form of the excess carbon may be varied to adjust the voids in the feedstock. Large voids produce longer whiskers with a more broad diameter range than feedstocks containing very small voids. It is important not to confuse voids with bulk density. Void size appears to be the controlling factor in whisker properties rather than the bulk density. However, bulk densities are given herein as a convenient comparison measure. For example, a low bulk density feedstock can have a high percentage of voids but the voids may be much smaller in size than voids in a higher density feedstock. The void size may be varied to control whisker properties. Small voids and low bulk density feedstocks produce small, short and uniform diameter whiskers.

Large-voided, high density feedstocks can be prepared by only very loosely mixing feedstocks, e.g. in a pinmixer. Such feedstocks give a broad range of whisker diameters and lengths. The larger voids can be obtained by using coked rice hull feedstocks or pelletized carbon and silica feedstocks. Even larger voids can be obtained with pelletized feedstocks by removing the small and large pellets to make all the pellets near sized. An alternative way of producing voids would be to mix the carbon and silica in substantially stoichiometric ratios and then add the excess carbon in another form, e.g. thermal black.

Feed mixing method is not critical as with prior art whisker processes. The carbon and silica can be mixed just about any way desired. For example, the feedstock may be slurried in water and spray dried to obtain a more uniform dispersion in pellet size. Of course, it is important that the carbon black and other feedstock ingredients be clean and free of coke, grit and large particles that will contaminate the final whisker product. The silica source is not critical. Ground quartz, amorphous precipitated silica, fume silica, etc. may be used. Just like carbon it is better if the particle size of the silica is small. Amorphous silica reacts easier and thus has a modest advantage over crystaline silica. The more intimate the feedstock mixing the better as long as the voids are controlled.

Although iron chloride is used in the present example, all kinds of iron compounds may be used, both soluable and insoluable. Preferred catalysts are iron oxide, iron powder, iron chloride, iron sulfate, etc. Also, it is well known that other metals such as lanthanum, nickel, cobalt, and other transition metals work as well as iron.

The activity of the catalyst at a given temperature can be used to vary product properties. For example, a very reactive catalyst such as iron sulphate, iron chloride or iron powder form much larger and much longer whiskers than the less reactive forms of iron such as iron oxides. Further, the iron in the final product is more leachable when iron chloride catalysts are used than when iron oxide catalyst are used. Therefore, iron chloride catalysts are most preferred.

The average whisker diameter and lengths of the reactor product increase with increasing catalyst content. The preferred level is an Fe:Si weight percent ratio of 12 percent. This produces whiskers in the present process of an average diameter by mass greater than 1 micron. When an iron to silicon ratio of 0.6 weight percent is used, the whisker diameters are less than one-third of those above. Catalyst ratios of 2–20 weight percent are sufficient to produce the generally preferred large whiskers. It is believed, contrary to prior teachings, that the homogneous dispersion of catalyst within the silica is not preferred. The catalyst within a silica gel produces very uniform but the less desired smaller whiskers. It is believe that the use of a reactive but separately added catalyst releases all of the catalyst at once and hence produces larger whiskers ranging up to 10 microns in diameter.

As previously stated the reaction zone temperature and pressure are held constant throughout the entire operation. It is very important for the growth of quality whiskers to have uniform conditions and it is a advantage of the present invention over the priod art processes that permits temperature, gas, component partial pressures and gas velocities and distribution to be more uniform. The temperature is held constant by varying the amount of electricity supplied to the electrodes heating the reaction zone. The pressure is held constant by adjusting two factors. First, the amount of vacuum applied to the cap on the top of the core and second, by adjusting the amount of nitrogen or inert purge gas entering the reactor electrode chamber. The present invention has found that by injecting approximately 85 liters per minute of nitrogen in to the electrode chamber and maintaining approximately 1000 Pa vacuum at the top of the core, the reactor pressure inside the core is held approximately at atmospheric pressure at the lower end of the core near the lifting mechanism and the pressure on the inside of the cores in the reaction zone is maintained at a lower pressure than that of the electrode chamber.

By doing this gases can be kept from leaking into the environment at the top and bottom of the reacting core stack and they also can be kept from leaking into the electrode chamber. As previously discussed, the nitrogen purge gas added to the electrode chamber seeps through cracks between each core section andd exits with the reaction offgases. This highly controlled environment prevents the buildup of pressure in any reaction cavity and promotes uniformity of reaction conditions and hence the high quality of whiskers produced.

Next, the core sections exit the hot reaction zone to the cooling zone where the core sections are cooled to approximately 120° C. The temperature profile of both the preheating and the cooling zone is not critical, other than to provide as rapid a temperature change at the reactor zone boundaries as practical to both initiate and quench the reaction in a controlled manner. The core sections coming out of the cooling zone of the reactor are removed two at a time by briefly raising the core section cap attached to the vacuum or suction line and momentarily allowing the reactor offgases to escape into a vented hood, 38 rather than the suction line, and manually lifting the core section off the stack two at a time. Of course one skilled in the art could automate both the adding and removal of core sections from the reactor. The core sections are then placed on a table and the trays are removed from each core one at a time. As the trays are removed the whisker product is carefully scraped or vacuumed off each tray plate. The whisker product of the reaction is vacuumed through a high-speed fan which breaks apart the clumps of whiskers and forms a fine fluffy powder composed of silicon carbide whiskers and particulate, carbon, and some unreacted feedstock. The silicon carbide whiskers are separated from the reactor product and cleaned in an appropriate manner.

The cleaned whiskers produced by the present invention were determined to be substantially SiC. Transmission electron micrographs (TEM's) were made of the subject whisker product from multiple runs and compared to available samples of whiskers produced by the prior art. The electron micrographs were digitized on a computer. Diameter and length of the whiskers of a photomicrograph were measured and aspect ratio, average diameter by count and average diameter by mass were calculated. Although scanning electron micrographs are acceptable, it is important to note that average diameters calculated based upon optical photographs are inaccurate in the size range of the present invention and are skewed to produce excessively large numbers.

The results of the comparison of whisker properties to available samples is set forth in the following chart.

| Present Invention | Silar | Tokai | GE Tokai | Tateho SEW-15 | Tateho SEW-1.615 |
|---|---|---|---|---|---|
| L/D ratio | | | | | |
| 18 | 24 | 27 | 23 | 25 | 21 |
| Diameter (Avg By Count) um | | | | | |
| 0.50– | 0.42 | 0.34 | N/A | 0.28 | N/A |
| Diameter (Avg by Mass) um | | | | | |
| 1.0–1.5 | 0.65 | 0.65 | N/A | 0.48 | N/A |

We claim:
1. A method of manufacturing silicon carbide whiskers in a furnace including a sleeve-like core having a central axis for receiving a porous silic and carbon feedstock, the core extending from a preheat zone having a temperature less than 1300° C., to a reaction zone having a temperature between substantially 1500° C. and 1700° C., and thence to a cooling zone having a temperature less than 1300° C., the furnace further including a plurality of heating elements disposed in a heating chamber defined by an annulus between an outer reactor shell of the furnace and a portion of the core within the reaction zone, the method comprising:
   (a) providing a plurality of heat-resistant tray assemblies each including a planar tray plate and a spacer, said tray plate defining a lower surface of a reaction cavity and having a circular periphery formed about an axis, said spacer positioned on and extending axially from a surface of said tray plate and having a substantially uniformly sized through channel aligned with said plate axis, and each of the tray plates having at least one bore hole adjoining said spacer channel;

(b) providing a first flow path for fluid communication between at least one of the reaction cavities and at least one of said spacer channels;

(c) placing the feedstock on each of said tray plates;

(d) stacking said plurality of tray assemblies serially within said core such that each of said tray plate axes is substantially aligned with said core central axis;

(e) providing a second flow path axially aligned within said core and passing through said spacer channels and the boreholes in the tray plates;

(f) providing a third flow path for maintaining fluid communication of oxide offgases between reaction cavities defined by tray plates of stacked tray assemblies;

(g) moving said tray assemblies axially through the preheat, reaction and cooling zones for reacting said feedstock to produce silicon carbide whiskers and oxide offgases;

(h) maintaining greater than atmospheric pressure within said heating chamber during step (g) to minimize flow of oxide offgases from the reaction cavities radially outward through said core; and (i) withdrawing oxide offgases through said axially aligned second flow path during steps (g) and (h) to uniformly relieve pressure within said core.

2. The method as defined in claim 1, wherein:
step (d) includes stacking said tray assemblies within a core section while outside the furnace; and
step (g) includes moving said core section and interiorly positioned tray assemblies simultaneously through the preheat, reaction and heating zones.

3. The method as defined in claim 2, further comprising:
fixing radial inwardly-directed projections on said core section;
supporting a lower tray assembly within said core section on the projections;
supporting each of a plurality of upper tray assemblies with said core section on a successively lower tray assembly; and
providing a gap between said lower tray assembly and an uppermost tray assembly within another lower core section for forming said first flow path for passing oxide offgases to said axially aligned second flow path.

4. The method as defined in claim 2, further comprising:
fixing radial inwardly-directed projections on said core section;
supporting a lower tray assembly within said core section on the projections;
supporting each of a plurality of upper tray assemblies within said core section on a successively lower tray assembly; and
providing leak paths between adjoining tray assemblies for forming said first flow path for passing oxide offgases to said axially aligned second flow path.

5. The method as defined in claim 1, wherein step (g) further comprises:
maintaining less than atmospheric pressure within at least a portion of said second flow path within the cooling zone.

6. The method as defined in claim 5, further comprising:
adjusting the less than atmospheric pressure within said second flow path in the cooling zone to enhance silicon carbide whisker formation within the reaction zone.

7. The method as defined in claim 5, wherein step (h) further comprises:
inserting an inert gas into the heating chamber during step (g).

8. The method as defined in claim 5, further comprising:
sizing at least some of said plate bore holes substantially less than the size of said uniform spacer channels to minimize radiant heating losses along said second flow path.

9. The method as defined in claim 1, further comprising:
moving oxide offgases through said second axially aligned flow path in a direction of movement of said tray assemblies through the furnace; and
maintaining slightly greater than atmospheric pressure within at least a portion of said second flow path within the preheat zone.

* * * * *